(12) United States Patent
Nomura et al.

(10) Patent No.: US 7,067,204 B2
(45) Date of Patent: Jun. 27, 2006

(54) SUBMERGED PLASMA GENERATOR, METHOD OF GENERATING PLASMA IN LIQUID AND METHOD OF DECOMPOSING TOXIC SUBSTANCE WITH PLASMA IN LIQUID

(75) Inventors: Shinfuku Nomura, Matsuyama (JP); Toyota Hiromichi, Matsuyama (JP)

(73) Assignee: National University Corporation Ehime University, Ehime (JP)

( * ) Notice: Subject to any disclaimer, the term of this patent is extended or adjusted under 35 U.S.C. 154(b) by 0 days.

(21) Appl. No.: 10/507,919

(22) PCT Filed: Mar. 31, 2003

(86) PCT No.: PCT/JP03/04139

§ 371 (c)(1),
(2), (4) Date: Jun. 6, 2005

(87) PCT Pub. No.: WO03/086615

PCT Pub. Date: Oct. 23, 2003

(65) Prior Publication Data

US 2005/0227115 A1    Oct. 13, 2005

(30) Foreign Application Priority Data

Apr. 1, 2002  (JP) ............................. 2002-098193
Oct. 29, 2002  (JP) ............................. 2002-313979

(51) Int. Cl.
*B01J 19/08* (2006.01)
*B01J 19/10* (2006.01)
*D01D 19/00* (2006.01)

(52) U.S. Cl. ...................... 428/698; 422/186; 422/292; 422/305; 204/157.42; 204/157.46; 204/489; 204/450; 427/430.1; 427/445

(58) Field of Classification Search ................ 428/698; 422/156, 292, 305; 427/430.1, 445; 204/157.42, 204/157.46, 489, 490
See application file for complete search history.

(56) References Cited

U.S. PATENT DOCUMENTS

| | | | | |
|---|---|---|---|---|
| 4,883,570 A | * | 11/1989 | Efthimion et al. | 204/170 |
| 4,886,001 A | * | 12/1989 | Chang et al. | 110/250 |
| 5,026,464 A | * | 6/1991 | Mizuno et al. | 588/311 |
| 5,270,515 A | * | 12/1993 | Long | 110/243 |
| 5,541,386 A | * | 7/1996 | Alvi et al. | 110/345 |

(Continued)

FOREIGN PATENT DOCUMENTS

EP            468395        *  1/1992

(Continued)

OTHER PUBLICATIONS

"*Liquid in Plasma Generated by a Combination of Acoustic Cavitation and Microwave Irradiation*", p. 56 of the proceeding Fourth All Ehime University Symposium, Nov. 2001.

*Primary Examiner*—Archene Turner
(74) *Attorney, Agent, or Firm*—Wenderoth, Lind & Ponack, L.L.P.

(57) ABSTRACT

A method and apparatus for generating plasma in a liquid. The apparatus includes an ultrasonic wave generator for generating bubbles in the liquid, and an electromagnetic wave generator for continuously irradiating electromagnetic waves to the liquid from within the liquid in order to generate plasma. The method of generating plasma in a liquid includes the steps of generating bubbles in the liquid by irradiating ultrasonic waves in the liquid, and generating plasma in the bubbles by continuously irradiating electromagnetic waves from within the liquid to the bubbles.

21 Claims, 5 Drawing Sheets

U.S. PATENT DOCUMENTS 5,886,316 A * 3/1999 Pierce .................. 110/346

FOREIGN PATENT DOCUMENTS

| | | |
|---|---|---|
| JP | 57-71982 | 5/1982 |
| JP | 6-246105 | 9/1994 |
| JP | 10-81589 | 3/1998 |
| JP | 11-309301 | 11/1999 |
| JP | 2001-252665 | 9/2001 |
| JP | 2002-301136 | 10/2002 |
| JP | 2002336650 * 11/2002 |
| WO | 02/38827 | 5/2002 |

* cited by examiner

SUBMERGED PLASMA GENERATOR, METHOD OF GENERATING PLASMA IN LIQUID AND METHOD OF DECOMPOSING TOXIC SUBSTANCE WITH PLASMA IN LIQUID

BACKGROUND OF THE INVENTION

1. Field of the Invention

The present invention relates to a method of generating plasma in a liquid and an apparatus therefor.

2. Description of Related Art

Conventionally, the deposition technique with vapor phase plasma is widely made use of as a deposition technique with the use of plasma. For example, JP-A-10-81589 describes formation of a diamond film on surfaces of silicon or cubic silicon carbide with the plasma CVD method. However, with such method, it is difficult to compose a large amount of deposited substance. When a source material such as methane, etc. is quickly supplied in order to increase the deposition rate, there is a fear of incurring a danger. Also, when high-energy plasma is generated in vapor phase, the temperature rises and it is not possible to perform deposition on a substrate material having a low degree of heat resistance.

On the other hand, formation of submerged plasma by ultrasonic cavitation and superposition of local electromagnetic fields described on page 56 of the proceeding in Fourth All Ehimê University Symposium is based on an exceedingly promising thought directed to generation of plasma in a liquid, but the document and the presentation present a principle at the start of such study and in no way describe how to concretely carry out such formation.

Subsequently, conventional methods of garbage disposal are described. It is general to burn garbage in an incinerator to discharge exhaust gases to the atmosphere after soot particles are removed by an electric precipitator or an adsorption filter. There have been tested a method of absorbing and removing gaseous dioxin present in exhaust gases by blowing-in of active carbon and an active-carbon adsorption tower, a method of decomposition removal by the use of a catalytic conversion tower, but these methods of removal involve problems in that after-treatment is necessary and the effect of treatment is dependent upon temperatures. That is, decomposition of dioxin is performed in high-temperature combustion reaction and so is exceedingly reduced in decomposing ability in the case of low combustion temperature. Also, in currently leading methods with the use of a bag filter, it is likewise necessary to perform treatment of decreasing gaseous dioxin in toxicity after the treatment of exhaust gases. Also, Polychlorinated Biphenyl (PCB), which has been used as an insulating oil for transformers in the past, is also accumulated and stored in large amounts because of the absence of effective processing means.

Also known is a method of decomposing dioxin, in which electromagnetic waves are irradiated on a liquid containing dioxin while the liquid is dripped so that plasma is generated for decomposition (for example, JP-A-2002-336650).

Conventional methods of treatment with the use of an incinerator involve a problem of the necessity of the treatment of finally making dioxin harmless. However, dioxin and PCB are substances, decomposition of which is exceedingly difficult, and even if it is possible to experimentally decompose a small amount of such substances, it is difficult to treat them in large amounts. A technique described in JP-A-10-81589 has its limit in rate of treatment when a liquid is decomposed while it is dripped. Accordingly, there are desired chemical reactors and methods of cracking treatment, in which such harmful substances are effectively decomposed and can finally be made harmless. Also, it is desirable to realize chemical reactors capable of effectively composing those substances, such as diamond or the like, which cannot be composed only at high temperature/high pressure.

It is an object to provide a submerged plasma generating apparatus and a submerged plasma generating method, in which high-energy plasma, which is macroscopically easy to handle at low temperatures is generated by generating plasma in a liquid. It is also an object to provide a technique that is capable of effectively performing decomposition of harmful substances, which are difficult to decompose, and composition of substances, which are difficult to compose, with the use of submerged plasma having a high energy.

SUMMARY OF THE INVENTION

A submerged plasma generating apparatus according to the invention comprises bubble generating means for generating bubbles in a liquid, and an electromagnetic wave generator for irradiating electromagnetic waves in the liquid. It is possible to select a heating device, a decompression device, an ultrasonic wave generator, which irradiates ultrasonic waves in a liquid, or the like, as the bubble generating means. As the liquid, it is also possible to select one containing hydrocarbon, in particular, dodecane. A substrate mount for mounting of a substrate being an object being formed with a thin film is provided, and a thin film such as an amorphous carbon film, a silicon carbide film, etc. can be formed on the surfaces of the substrate.

The apparatus may comprise a vessel for accommodating therein a liquid, supply means for continuously supplying the liquid to the vessel, and discharge means for discharging the liquid from the vessel, and may cause chemical reaction due to plasma in the liquid. When the liquid contains harmful substances, plasma may be generated in the liquid to decompose the harmful substances. In particular, when the liquid contains dioxin or polychlorinated biphenyl (PCB), the apparatus may decompose the dioxin or PCB.

A submerged plasma generating method according to the invention comprises generating bubbles in a liquid, and irradiating electromagnetic waves on the bubbles to generate plasma in the bubbles. It is also possible to irradiate ultrasonic waves in a liquid containing harmful substances to generate bubbles in the liquid and to irradiate electromagnetic waves on the bubbles to generate plasma in the bubbles. In particular, the liquid may contain dioxin or polychlorinated biphenyl.

DETAILED DESCRIPTION OF THE INVENTION

The invention will be described in more detail with reference to the drawings.

Figure 1:
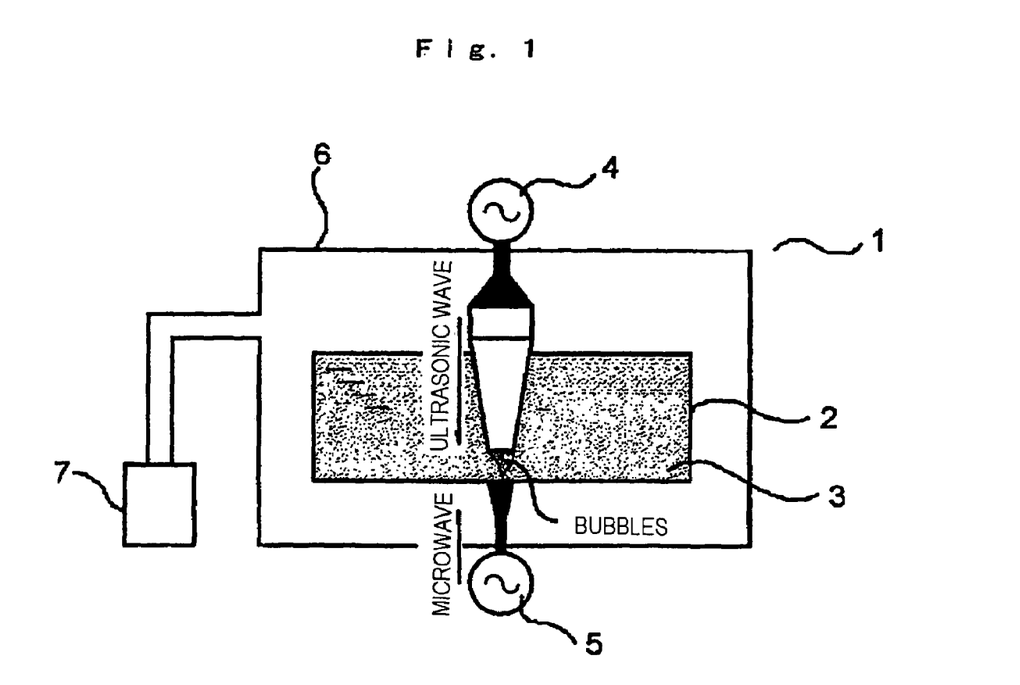
FIG. 1 is an explanatory view showing a submerged plasma generating apparatus.

Embodiments of the invention will be described below. FIG. 1 is a view illustrating an example of a submerged plasma generating apparatus according to the invention. A liquid 3 is accommodated in a vessel 2 of the submerged plasma generating apparatus 1. It is possible to select various liquids according to the use of the plasma. In a case of carrying out surface deposition, a liquid being a material of a deposited substance, a solution containing a material of a deposited substance, or the like is used. Also, in order to deposit a diamond film, it is possible to use a liquid containing carbon being a material of diamond, and in particular, the use of hydrocarbon containing hydrogen is advantageous in deposition of a pure diamond film because graphite generated in a diamond layer at the time of deposition is reduced and removed. In particular, dodecane ($C_{12}H_{26}$) is effective since it is in a liquid state and is low in viscosity even at room temperature to make ultrasonic waves and electromagnetic waves hard to dampen.

A tip end of an ultrasonic wave generator 4 making use of a horn type oscillator is put in a liquid 3 to irradiate ultrasonic waves in the liquid. The ultrasonic waves generate numerous bubbles. That is, the ultrasonic wave generator 4 acts as means that generates bubbles in the liquid. As the bubble generating means, a heating device to heat a liquid, a pressure reduction device, such as vacuum pump, etc., to reduce pressure in the vessel 2, or the like may be used in addition to an ultrasonic wave generator. A substance of the liquid 3 such as dodecane, etc. in gaseous phase is contained in bubbles and ultrasonic waves cause gases in the bubbles to quickly repeat expansion and contraction. A substantially adiabatic compression is performed at the time of contraction, so that superhigh pressure and high temperature are established in the bubbles to be liable to generate plasma.

An electromagnetic wave generator 5 is provided in the submerged plasma generating apparatus according to the invention to irradiate electromagnetic waves at a position in the liquid 3, where bubbles are generated. It suffices to select frequency and output of the electromagnetic waves according to the type and intensity of the plasma being generated, and microwaves on the order of 2 GHz or higher are mainly used. High-energy plasma is generated in bubbles by superposition of electromagnetic waves in a state of high temperature and high pressure, which state is caused by ultrasonic waves. In addition, the vessel 2 in the embodiment is received in an external vessel 6 and can be reduced in pressure by means of a vacuum pump 7. Pressure reduction makes it easy for bubbles to be generated in the liquid, thus facilitating the starting of plasma generation. When the ultrasonic wave generator 4 is used as the bubble generating means and plasma is generated so as to be made stable, plasma continues to be generated in most cases even when the vacuum pump is stopped and atmospheric pressure is restored.

In the above manner, it is possible to generate high-energy plasma having a high density in the liquid. Since plasma has been already confined in bubbles, confinement of plasma thus generated, which presents an important problem in plasma technology, is not problematic in the invention. While plasma of high temperature and high pressure is generated locally, it is confined in a liquid having a large thermal capacity, so that the temperature is macroscopically low. Accordingly, things in contact with the plasma and outside thereof are not heated. Since plasma thus generated is high in temperature, pressure, and energy density and easy to handle, it is usable for vapor deposition, chemical compounding of substances, nuclear fusion, or the like. Further, it is applicable to electrolysis in a high-energy state and usable for decomposition of a toxic substance such as dioxin, etc. Bubbles generated by acoustic cavitation include single bubbles and multi-bubbles, and the invention is applicable to both. While single bubbles are small as a whole in energy, a high-energy state of 5000 K to 100000 K is obtained in the bubbles only by irradiation of ultrasonic waves, so that they are effective for reactors of nuclear fusion, or the like. On the other hand, multi-bubbles are a little low in temperature and on the order of 5000 K or so in the case of only irradiation of ultrasonic waves, but are large as a whole in energy and advantageous in industrial use such as deposition processing, or the like.

While the plasma generating apparatus according to the invention is simple and small in size and can be formed of a size so that it can be placed on a desk, it can be also be constructed on a large-scale with the use of an ultrasonic wave generator and an electromagnetic wave generator, which are high in output.

Subsequently, the invention will be further described on the basis of specific embodiments.

Figure 2:
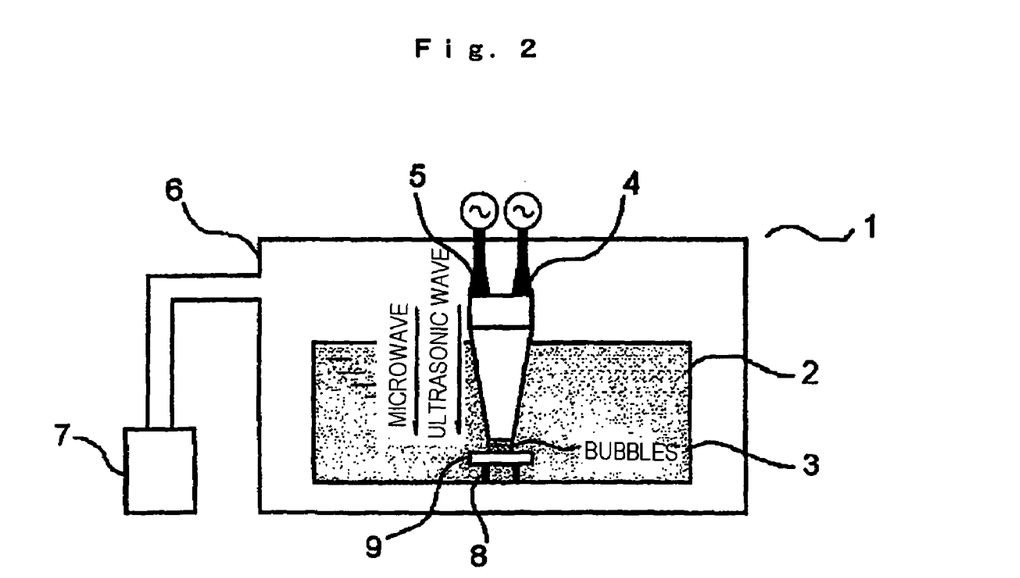
FIG. 2 is an explanatory view showing a first embodiment of a submerged plasma generating apparatus according to the invention.

FIG. 2 is an explanatory view showing a first embodiment of a submerged plasma generating apparatus according to the invention. The embodiment presents an example, in which the invention is applied to deposition of diamond or the like. Dodecane of high purity is used as the liquid 3 in the vessel 2, and the ultrasonic wave generator 4, which is a horn type oscillator, and the electromagnetic wave generator 5 are provided in the dodecane with tip ends thereof close to each other to irradiate ultrasonic waves and microwaves into the dodecane. Also, a substrate mount 8 is provided on a bottom of the vessel for mounting thereto a substrate 9. Ultrasonic waves and microwaves are concentratedly irradiated in the vicinity of a surface of the substrate 9 to generate a cloud of bubbles and plasma in the vicinity of the substrate 9. Microwaves of 2.5 GHz were irradiated at the output power of 120 W. The ultrasonic wave generator 4 of 19.5 kHz having an output of 0 to 600 W was used. The vacuum pump was actuated to change the pressure in the range of 10 to 1000 hPa. When ultrasonic waves and microwaves were irradiated, plasma was intensely emitted such that it could be visually recognized. When pressure was in the range of 10 to 100 hPa, white luminous plasma was confirmed, and when pressure was in the range of 100 to 1000 hPa, orange luminous plasma was confirmed. While decompression easily generates plasma when generation of plasma is to be started, plasma continues even when decompression is stopped to restore the atmospheric pressure after stabilization of the generated plasma. Plasma thus generated can continue over a long time as long as irradiation of ultrasonic waves and microwaves continues.

After irradiation of ultrasonic waves and microwaves, there existed a brown dissolved material and a black material of poor solubility generated from the dodecane. Since the molecular density is very high in the liquid phase as compared with that in the vapor phase, a far higher rate of composition relative to that obtained in a vapor deposition method is obtained. Also, the liquid produces a cooling effect due to deposition in the liquid, a material having a low degree of heat resistance can be used as the substrate, and deposition can be processed on a surface of a material, such as plastic, paper, wood, etc., which has not been conventionally obtainable. High-energy plasma is generated in hydrocarbon such as dodecane or the like to be able to perform composition and deposition of diamond and to perform composition of fullerene and carbon nanotube. Further, coatings of TiC, SiN, TiN, etc. can be obtained by means of various liquids other than dodecane. In addition, since plasma can be continued, the substrate mount is made movable to enable deposition to be performed over a wide range on surfaces of the substrate.

Plasma can be generated with the use of the submerged plasma generating apparatus 1, shown in FIG. 2, and kerosene as the liquid in place of dodecane. While it was a little more difficult to start generation of plasma than with dodecane, plasma was stably continued after the generation. In this case, high-energy plasma being white luminous was also confirmed. While dodecane is a main component of kerosene, hydrocarbon having a smaller molecular weight than that of dodecane and hydrocarbon having a larger molecular weight than that of dodecane are intermixed in kerosene, so that generation of high-energy plasma in kerosene indicates that the invention is also effective in multicomponent mixed liquids.

Figure 3:
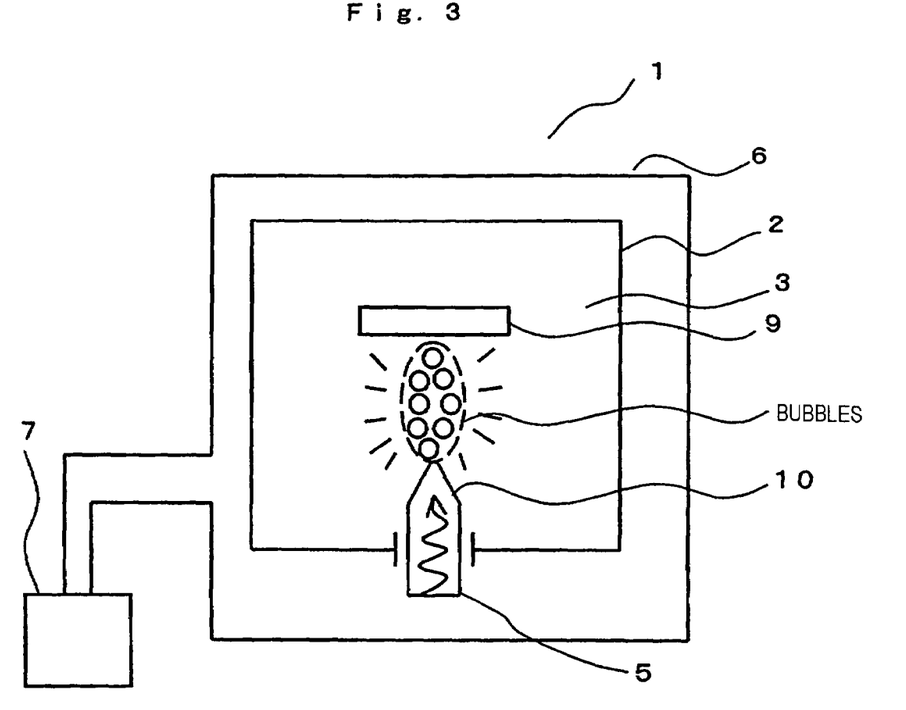
FIG. 3 is an explanatory view showing a second embodiment of a submerged plasma generating apparatus according to the invention.

FIG. 3 is an explanatory view showing a second embodiment of a submerged plasma generating apparatus according to the invention. Dodecane is used in the embodiment. An electrode 10 is provided in the liquid 3. An oscillation circuit (not shown) is connected to the electrode 10 to supply electric power thereto with high frequency. Electromagnetic waves are generated on the electrode 10 to be concentrated on a tip end of the electrode in the second embodiment. Therefore, the tip end of the electrode is subjected to induction heating by electromagnetic waves. Heat generated at this location heats the liquid 3, which is in contact with the electrode 10, and the liquid boils to generate bubbles. That is, according to the embodiment, the electrode 10 also acts as heating means for generating bubbles. Also, the electrode 10 acts as an electromagnetic-wave probe, so that electromagnetic waves concentrated on the electrode 10 are irradiated on the liquid 3. The inside of the bubbles is in a state liable to generate bubbles, and irradiation of intense electromagnetic waves there forms plasma. In the embodiment, a further large external vessel 6 is provided in a manner to cover the liquid vessel 2 and can be reduced in pressure by the vacuum pump 7. While reduction in pressure is not necessarily needed, it has an advantage in facilitating generation of bubbles and plasma.

While it suffices to select electromagnetic waves as irradiated among ones having a frequency of 13 MHz to 2.5 GHz depending on the uses, electromagnetic waves having a frequency of 2.5 GHz and an output of 100 W were used in the embodiment because such waves are effective in the formation of a diamond film and advantageous in the generation of bubbles by heating.

Figure 4:
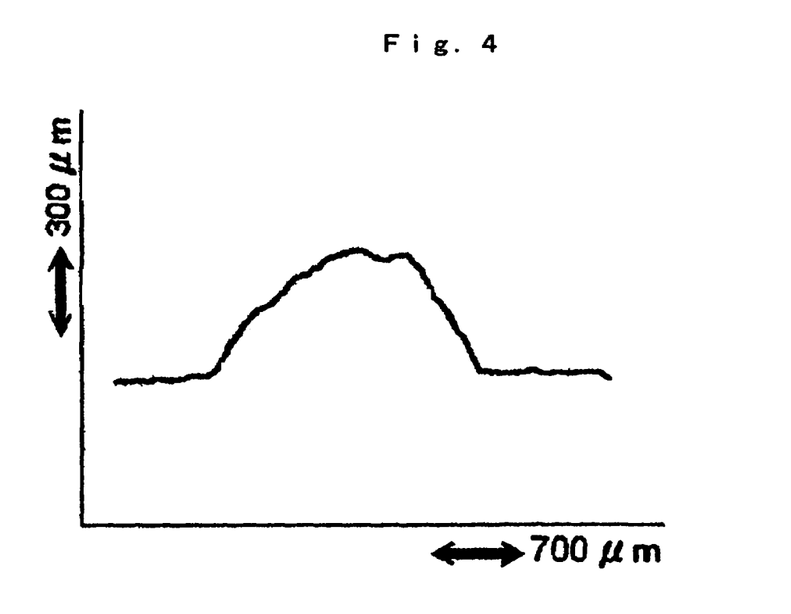
FIG. 4 is a graph indicating the surface configuration of an amorphous carbon film as formed.

Plasma generated in bubbles rose together with the bubbles to come into contact with the substrate 9. Thereby, carbon making high-energy plasma formed a film on surfaces of the substrate 9. FIG. 4 is a graph indicating measurement of the formed film measured by a surface roughness meter. A thick film having a thickness of 450 μm was formed on surfaces of the substrate 9 in film-formation time of 3 minutes. That is, the film forming rate reached 9 mm/h, and thus a markedly high film forming rate was realized as compared with the forming rate of a diamond film by the use of a conventional vapor-phase plasma, which is around 10 μm/h in a low-pressure type and around 300 μm/h in a high-pressure type.

Figure 5:
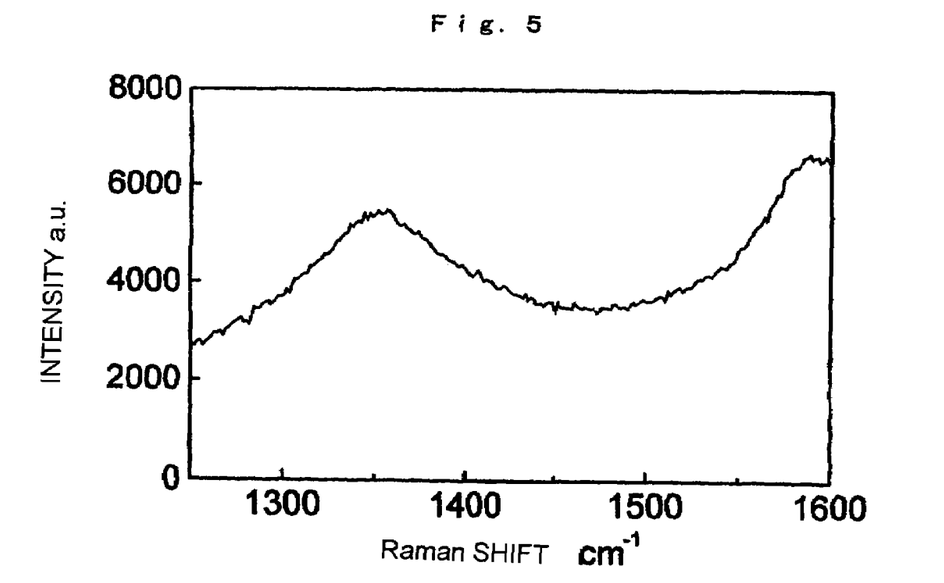
FIG. 5 is a graph indicating a Raman spectrum of the amorphous carbon film as formed.

FIG. 5 indicates a Raman spectrum thus formed. It was found that the spectrum extends so as to have two mountains around 1335 $cm^{-1}$ and around 1560 $cm^{-1}$ and the film structure is amorphous. The film has a Vickers hardness Hv on the order of 1500 and has a low frictional resistance. The film formed in the embodiment can be used to increase the hardness of bladed tools to enhance the durability, and increase corrosion resistance with the use of chemical inertness. Also, the film can be applied on a contact portion to improve the lubrication property.

According to the second embodiment, the electrode 10 unites the functions of bubble generating means and electromagnetic wave generating means (electromagnetic wave probe), and a set of electromagnetic-wave supply circuits is sufficient, so that there is produced an advantage that the construction becomes simple. Also, since the substrate 9 is not directly charged with electricity and heated, it is possible to form a film on surfaces of a non-conducting material, such as wood, paper, etc., and a material, such as synthetic resin, biomaterial, etc., having a low degree of heat resistance.

Figure 6:
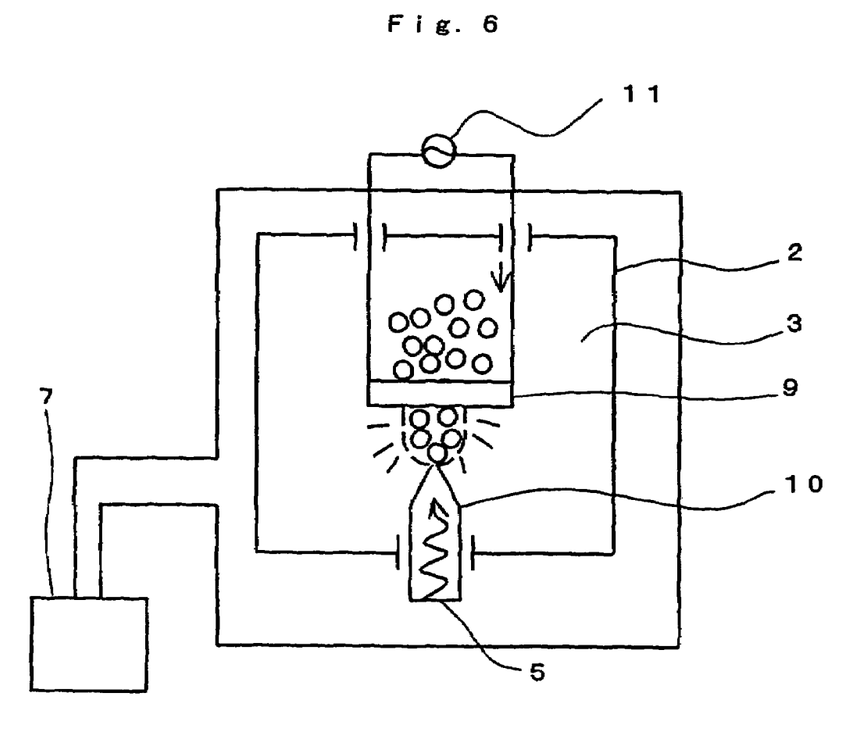
FIG. 6 is an explanatory view showing a third embodiment of a submerged plasma generating apparatus according to the invention.

FIG. 6 is a view showing a third embodiment of a submerged plasma generating apparatus according to the invention. According to the embodiment, an electric source 11 is provided to heat the substrate 9 by supplying an electric current to the substrate 9 to heat the same. This embodiment uses a silicone substrate as the substrate 9. In this manner, the provision of heating means separately from electromagnetic wave irradiation means (electromagnetic wave probe) produces an advantage of facilitating the generation of bubbles and hence the generation of plasma. For example, by carrying an electric current to a silicone substrate to heat the same to around 700° C., it is possible to form a diamond film on surfaces of the substrate. According to the third embodiment, the electrode 10, which irradiates electromagnetic waves in a liquid, is provided below the substrate 9 whereby it is possible to irradiate electromagnetic waves in a concentrated manner on the bubbles, which are generated below the substrate 9. While bubbles, which are generated above the substrate 9, rise and get away immediately from the substrate 9, bubbles, which are generated below the substrate 9, remain for some time in contact with the substrate 9, so that plasma generated in the bubbles can be caused to effectively contact the substrate.

According to the third embodiment, a mixture of dodecane and a silicone oil with a ratio of 1:1 was used as the liquid 3 and a silicon carbide film was formed on the substrate 9 made of a silicone plate. Electromagnetic waves having a frequency of 2.5 GHz and an output of 100 W were irradiated for 3 minutes, and a silicon carbide film having a thickness of 1.2 mm could be formed on the substrate 9. Accordingly, the forming rate of the film reached 0.4 mm/min. According to the embodiment, a vacuum pump was actuated to reduce pressure to around $10^4$ Pa in the vessel 2. The silicon carbide film thus formed had a high hardness, and thus can be used for the purpose of increasing the hardness of a cutting tool to extend its service life and improve its sharpness.

Figure 7:
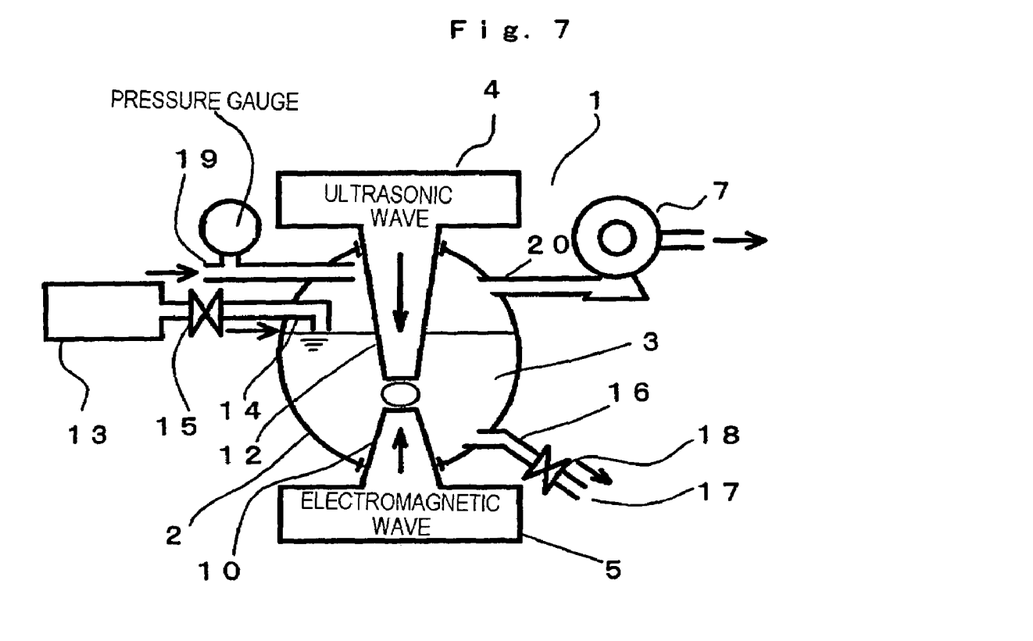
FIG. 7 is an explanatory view showing a fourth embodiment of a submerged plasma generating apparatus according to the invention.

FIG. 7 is a view showing a fourth embodiment of a submerged plasma generating apparatus according to the invention. The submerged plasma generating apparatus 1 comprises a vessel 2 for receiving a liquid 3 containing harmful substances, an ultrasonic wave generator 4 for generating bubbles in the liquid 3, and an electromagnetic-wave generator 5 for irradiating electromagnetic waves at a location where bubbles are generated. The ultrasonic wave generator 5 makes use of a horn type oscillator and comprises an ultrasonic horn 12. An electromagnetic-wave electrode 10 of the electromagnetic wave generator 5 is provided in opposition to the ultrasonic horn 12, and high-temperature plasma is generated on the ultrasonic horn 12 and the electromagnetic-wave electrode 10.

A tank 13, which stores a liquid containing harmful substances, is provided and a supply pipe 14, through which the liquid is supplied to the vessel 2 from the tank, is connected to an upper portion of the vessel 2. Also, the supply pipe 14 is provided with a first control valve 15. On the other hand, a discharge pipe 16 serving as discharge means for discharging the liquid from the vessel 2 is provided on a lower portion of the vessel 2 to afford discharging the liquid to a waste liquid port 17. The discharge pipe 16 is provided with a second control valve 18.

Thus, the fourth embodiment is of a sequential processing system, in which the supply pipe 14 and the discharge pipe 16, respectively, are provided with the openable control valve, and a process is repeated, in which a predetermined amount of the liquid is supplied to the vessel 2 from the tank 13 to carry out decomposition processing, and the liquid, after it has been made harmless, is discharged from a discharge port 11.

The vessel 2 is in the form of a closed tank provided with an intake pipe 19, through which a carrier gas is introduced from outside, and an exhaust pipe 20 connected to the vacuum pump 7. Harmless gases generated in the decomposition processing of harmful substances are discharged outside of the vessel 2 through the exhaust pipe 20 by the vacuum pump 7. The vacuum pump 7 can be also used to reduce pressure in the vessel 2.

In the fourth embodiment, plasma having a temperature of 5000 K was generated. When decomposition processing was performed in a solution, in which 1 μg of OCCD (octachlorodibenzoparadioxin) was added to 80 ml of n-dodecane, all of OCCD in the solution could be decomposed in 30 seconds. In addition, the ambient atmospheric pressure was regulated to 500 Pa.

Figure 8:
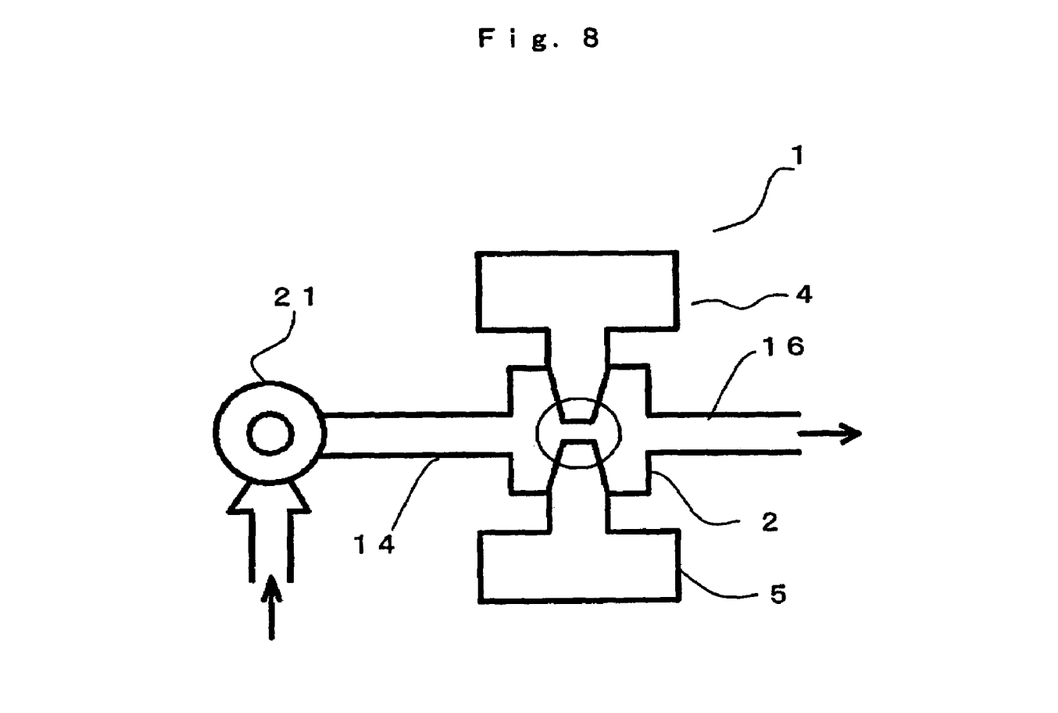
FIG. 8 is an explanatory view showing a fifth embodiment of a submerged plasma generating apparatus according to the invention.

FIG. 8 is an explanatory view showing a fifth embodiment of a submerged plasma generating apparatus according to the invention. The embodiment is an example of a flow type chemical reactor. In the embodiment, a relatively small-sized vessel 2 is provided between a supply pipe 14 and a discharge pipe 16. A pump 21 forcedly causes a liquid to flow. In the same manner as the fourth embodiment, an ultrasonic wave generator 4 and an electromagnetic wave generator 5 are positioned so as to be opposed to each other in the vessel 2, and high-temperature plasma is generated between the generators to cause a chemical reaction. The submerged plasma generating apparatus 1 can be mounted midway of the piping or the like to be used such that it is provided on a drain pipe in shop facilities, in which harmful substances are generated, to decompose the harmful substances and discharge a liquid that is harmless to the environment. While the chemical reaction for decomposition of harmful substances is performed in a state of high-temperature and high-pressure, temperature is macroscopically low because the plasma is generated in the liquid, so that the apparatus can be installed over a wide region.

Figure 9:
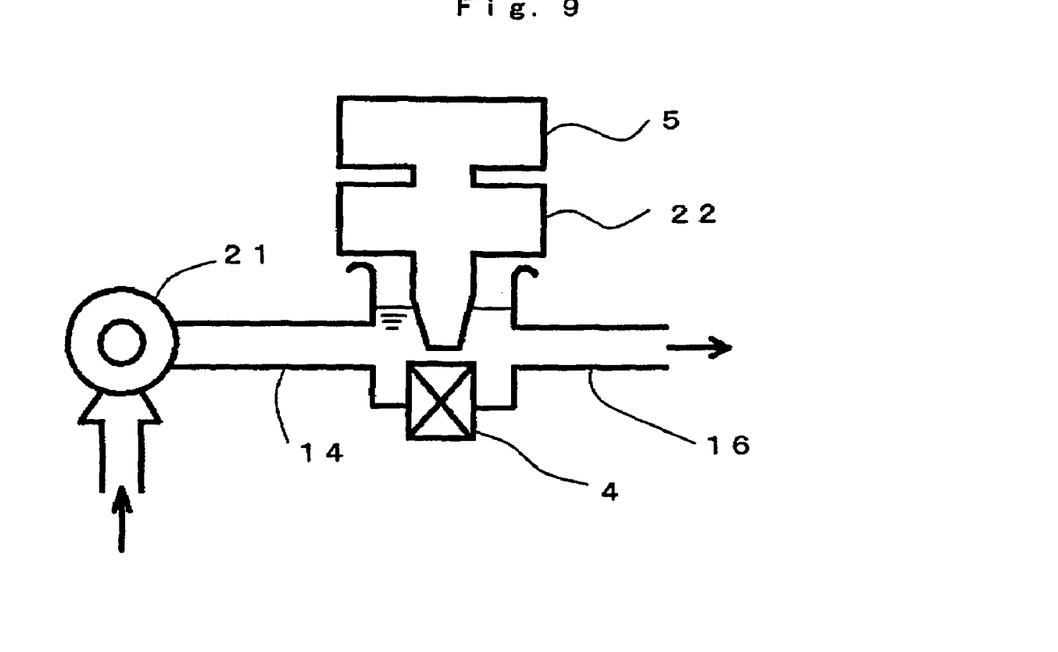
FIG. 9 is an explanatory view showing a sixth embodiment of a submerged plasma generating apparatus according to the invention.

FIG. 9 is an explanatory view showing a sixth embodiment of a submerged plasma generating apparatus according to the invention. An electromagnetic wave generator 5 is provided with an electromagnetic wave amplifier 22 to generate microwaves. Concentration of electromagnetic-wave energy enables generation of plasma even under the atmospheric pressure to cause chemical reaction. Accordingly, in the case where harmful gases are not generated due to chemical reaction, there is no need to make vessel 2 closed, and the vessel can be structured to be opened upwardly. Also, an ultrasonic wave generator 4 may be as simple as an ultrasonic washer, and agitation caused by ultrasonic waves makes it possible to increase the reaction rate. When decomposition processing was performed in a solution, in which 1 μg of OCCD was added to 60 ml of n-dodecane, all of the OCCD in the solution was decomposed in 8 seconds.

Figure 10:
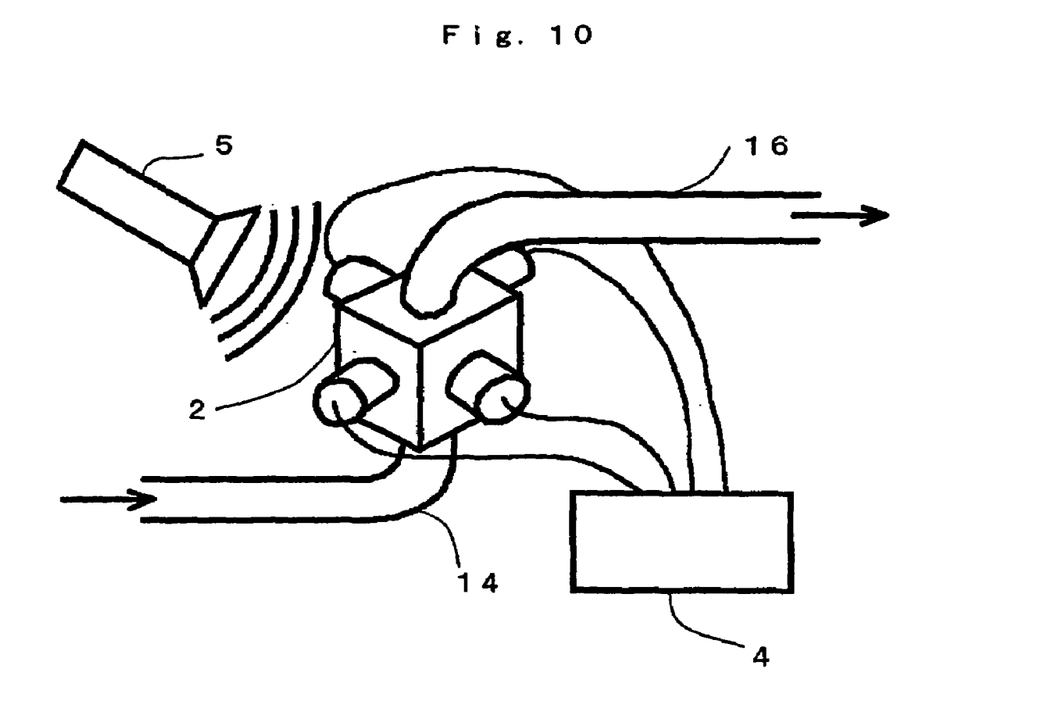
FIG. 10 is an explanatory view showing a seventh embodiment of a submerged plasma generating apparatus according to the invention.

FIG. 10 is an explanatory view showing a seventh embodiment of a submerged plasma generating apparatus according to the invention. The embodiment is an example of an ultrasonic concentration type reactor. A plurality of ultrasonic wave generators 4 are provided so as to be directed toward a center of a vessel 2. By concentrating ultrasonic energy on the center of the vessel 2 and subjecting single bubbles, which are trapped, to adiabatic compression, a state of ultrahigh temperature of 100000 K and ultrahigh pressure of 1 GPa or higher can be developed at the center of the vessel 2 even in an atmosphere at the atmospheric pressure and room temperature and further harmful substances, which are difficult to decompose, can be decomposed. The electromagnetic wave generator 5 is used to superpose electromagnetic waves in order to enlarge a region in the state of ultrahigh temperature and ultrahigh pressure.

According to the invention, bubbles are generated in a liquid and electromagnetic waves are irradiated on the bubbles whereby it is possible to safely and readily generate high-energy plasma in the liquid. The submerged plasma is widely usable for formation of a film on a substrate, effective decomposition processing of recalcitrant, harmful substances such as dioxin, PCB, etc., or the like.

The invention claimed is:

1. A submerged plasma generating apparatus comprising bubble generating means for generating bubbles in a liquid, and an electromagnetic wave generator for continuously irradiating electromagnetic waves to the liquid from within the liquid.

2. The submerged plasma generating apparatus according to claim 1, wherein the bubble generating means comprises a heating device.

3. The submerged plasma generating apparatus according to claim 1, wherein the bubble generating means comprises a decompression device.

4. The submerged plasma generating apparatus according to claim 1, wherein the bubble generating means comprises an ultrasonic wave generator for irradiating ultrasonic waves in a liquid.

5. The submerged plasma generating apparatus according to claim 1, further comprising a substrate mount for mounting of a substrate being an object being formed with a thin film.

6. The submerged plasma generating apparatus according to claim 1, wherein the liquid contains hydrocarbon.

7. The submerged plasma generating apparatus according to claim 6, wherein the liquid contains dodecane.

8. The submerged plasma generating apparatus according to claim 5, wherein an amorphous carbon film is formed on surfaces of the substrate.

9. The submerged plasma generating apparatus according to claim 5, wherein a silicon carbide film is formed on surfaces of the substrate.

10. The submerged plasma generating apparatus according to claim 5, further comprising a vessel for accommodating therein a liquid, supply means for continuously supplying the liquid to the vessel, and discharge means for discharging the liquid from the vessel.

11. The submerged plasma generating apparatus according to claim 4, wherein the liquid contains harmful substances and plasma is generated in the liquid for decomposing harmful substances.

12. The submerged plasma generating apparatus according to claim 11, wherein the liquid contains dioxin or polychlorinated biphenyl (PCB).

13. A submerged plasma generating method of generating bubbles in a liquid, and continuously irradiating electromagnetic waves from within the liquid on bubbles for generating plasma in the bubbles.

14. A harmful decomposition method with submerged plasma, the method comprising irradiating ultrasonic waves in a liquid, which contains harmful substances, for generating bubbles in the liquid, and continuously irradiating electromagnetic waves from within the liquid on the bubbles for generating plasma in the bubbles to decompose harmful substances in the liquid.

15. The harmful decomposition method with submerged plasma, according to claim 14, wherein the liquid contains dioxin or polychlorinated biphenyl.

16. The submerged plasma generating apparatus according to claim 2, further comprising a substrate mount for mounting of a substrate being an object being formed with a thin film.

17. The submerged plasma generating apparatus according to claim 3, further comprising a substrate mount for mounting of a substrate being an object being formed with a thin film.

18. The submerged plasma generating apparatus according to claim 4, further comprising a substrate mount for mounting of a substrate being an object being formed with a thin film.

19. The submerged plasma generating apparatus according to claim 2, wherein the liquid contains hydrocarbon.

20. The submerged plasma generating apparatus according to claim 3, wherein the liquid contains hydrocarbon.

21. A method of forming a silicon carbide film on surfaces of a substrate, the method comprising irradiating ultrasonic waves in a liquid, which contains silicon, to generate bubbles in the liquid, continuously irradiating electromagnetic waves from within the liquid on the bubbles to generate plasma in the bubbles, and causing the bubbles to come into contact with the substrate.

\* \* \* \* \*